United States Patent
Gorman

(10) Patent No.: US 9,647,326 B1
(45) Date of Patent: May 9, 2017

(54) HIGH-EFFICIENCY BROADBAND ANTENNA

(71) Applicant: Worldwide Antenna Systems LLC, Kingston, MA (US)

(72) Inventor: Kurt Gorman, Quakertown, PA (US)

(73) Assignee: WorldWide Antenna Systems LLC, Kingston, MA (US)

( * ) Notice: Subject to any disclaimer, the term of this patent is extended or adjusted under 35 U.S.C. 154(b) by 0 days.

(21) Appl. No.: 14/217,442

(22) Filed: Mar. 17, 2014

Related U.S. Application Data

(60) Provisional application No. 61/800,184, filed on Mar. 15, 2013.

(51) Int. Cl.
    *H01Q 9/00*     (2006.01)
    *H01Q 1/36*     (2006.01)
    *H01Q 1/50*     (2006.01)

(52) U.S. Cl.
    CPC ............... *H01Q 1/36* (2013.01); *H01Q 1/50* (2013.01)

(58) Field of Classification Search
    CPC ................................. H01Q 1/36; H01Q 1/50
    USPC ................... 343/745, 722, 725, 893
    See application file for complete search history.

(56) References Cited

U.S. PATENT DOCUMENTS

| | | | | |
|---|---|---|---|---|
| 4,335,469 A | * | 6/1982 | Tharp et al. | 455/125 |
| 5,155,495 A | * | 10/1992 | Hately | H01Q 21/29 343/725 |
| 6,025,813 A | | 2/2000 | Hately et al. | |
| 6,486,846 B1 | * | 11/2002 | Hart | H01Q 21/24 343/773 |
| 7,113,138 B2 | | 9/2006 | Hately et al. | |
| 2003/0085847 A1 | * | 5/2003 | Waltho | H01Q 21/29 343/850 |
| 2003/0107524 A1 | * | 6/2003 | Hart | H01Q 21/24 343/860 |
| 2004/0008153 A1 | * | 1/2004 | Lamensdorf | H01Q 1/362 343/895 |
| 2005/0128154 A1 | * | 6/2005 | Hately | H01Q 7/00 343/725 |

FOREIGN PATENT DOCUMENTS

| | | |
|---|---|---|
| GB | 2 215 524 A | 9/1989 |
| GB | 2 330 695 A | 4/1999 |
| GB | 2 387 969 A | 10/2003 |

OTHER PUBLICATIONS

Valentino Trainotti, Luis Dorado, On the Crossed Field Antenna Perfomance, Sep. 2006, IEEE Transactions on Broadcasting Vo. 52, No. 3, pp. 299-317.*

* cited by examiner

*Primary Examiner* — Graham Smith
*Assistant Examiner* — Jae Kim
(74) *Attorney, Agent, or Firm* — Hunter Clark PLLC

(57) ABSTRACT

A design for high-efficiency broadband antennas which includes a D-plate and an E-cylinder, electrically insulated from each other, the E-cylinder being above the D-plate, and both parts insulated from a ground plane. The E-cylinder and D-plate may be fed by distinct feed networks with adjustable impedance.

10 Claims, 5 Drawing Sheets

Measured input impedance:

Measured input VSWR:

HIGH-EFFICIENCY BROADBAND ANTENNA

CROSS-REFERENCE TO RELATED APPLICATION

This application claims priority to U.S. Provisional Application No. 61/800,184, entitled "High-Efficiency Broadband Antenna," filed 15 Mar. 2013, the entire disclosure of which is hereby incorporated by reference.

TECHNICAL FIELD

This application relates to crossed-field radio-frequency antennas.

BACKGROUND

A crossed-field antenna ("CFA") is a type of antenna designed for long and medium wave broadcasting. Conventional CFAs were first developed by Hately & Kabbary (see U.S. Pat. No. 5,155,495, issued 13 Oct. 1992; U.S. Pat. No. 6,025,813, issued 15 Feb. 2000; and U.S. Pat. No. 7,113,138, issued 26 Sep. 2006). These authors describe an antenna with two parts, one of which produces a high frequency electric field, and the other of which produces a high frequency magnetic field. The electric and magnetic field lines are arranged to cross, and thereby synthesize and propagate radio waves. CFAs based on the Hately and Kabbary design typically consist of two driven elements and a ground plane in various configurations, tuned by means of one antenna tuning unit ("ATU") or feed circuit.

Such CFAs were touted as a highly efficient antenna design that uses far less height than conventional antennas. Although there was initial excitement about such antennas in the 1980s and early 1990s, the efficiency of prior art designs, based on real-world testing, did not live up to the initial expectations.

Because these initial CFA designs were not as efficient as initially expected, there is a need for a design that retains the size advantages of a conventional CFA, but is capable of high efficiency for its size.

BRIEF SUMMARY

Described herein are embodiments including a high-efficiency broadband antenna comprising: a D-plate comprising a horizontal conductor raised above and insulated from a ground plane, and a D-plate feed conductor; an E-cylinder comprising a vertical hollow conductive cylinder of smaller diameter than the D-plate, which is mounted concentrically above and insulated from the D-plate, and an E-cylinder feed conductor; a transmitter input feed, connected to a source of modulated alternating current; a first antenna feed network, with adjustable impedance, configured to feed approximately half of the power from the transmitter input feed to the E-cylinder; and a second antenna feed network, with adjustable impedance, configured to feed approximately half of the power from the transmitter input feed to the D-plate.

Various additional embodiments, including additions and modifications to the above embodiments, are described herein or would be apparent to a person working in this field.

BRIEF DESCRIPTION OF THE DRAWINGS

The accompanying drawings, which are incorporated into this specification, illustrate one or more exemplary embodiments of the inventions disclosed herein and, together with the detailed description, serve to explain the principles and exemplary implementations of these inventions. One of skill in the art will understand that the drawings are illustrative only, and that what is depicted therein may be adapted based on the text of the specification or the common knowledge within this field.

In the drawings.

DETAILED DESCRIPTION

The present disclosure describes high-efficiency broadband antennas and associated circuitry systems that overcome the efficiency limitations of prior art CFAs.

Various example embodiments of the present inventions are described herein. Those of ordinary skill in the art will realize that the following detailed description is illustrative only and is not intended to be in any way limiting. Other embodiments will readily suggest themselves to such skilled persons having the benefit of this disclosure.

In the interest of clarity, not all of the routine features of the implementations described herein are shown and described. In the development of any such actual implementation, numerous implementation-specific decisions must be made in order to achieve the developer's specific goals, such as compliance with application, safety, regulatory, and business constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
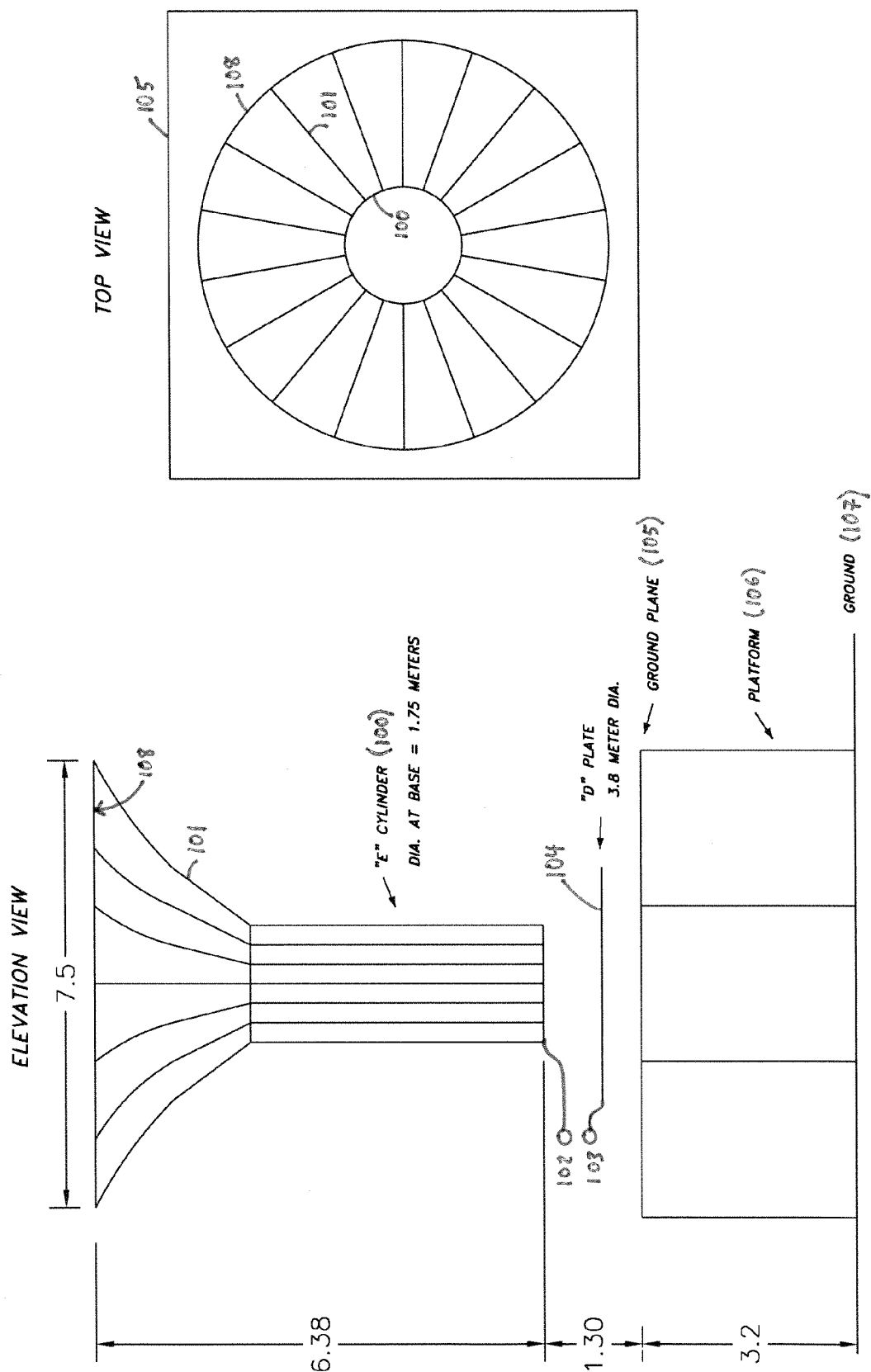
FIG. 1 is a drawing illustrating an example antenna, including an elevation view and top view.

FIG. 1 shows one embodiment of high-efficiency broadband antenna. In this embodiment, the antenna system includes cylindrical structure called an E-cylinder 100. In one embodiment, the E-cylinder may be a hollow metal cylinder. It may be formed of a sheet of metal or concentric sheets of metal, either solid or perforated by openings, or in one embodiment it may be formed of a lattice of metal wires, tubes, or bars. These wires, tubes or bars may, in one embodiment, be arranged in a cage-like structure with vertical bars. These bars may be joined at the top and/or bottom by rings. Each E-cylinder may be connected by a conductive feed 102 such as a coaxial cable.

In one embodiment, the E-cylinder extends into to a funnel structure 101 connected to the cylindrical part of the E-cylinder at its top end. In one embodiment, this funnel structure may have a roughly cone shape or a tapering cone or funnel shape. This structure may radiate out from the cylindrical part of the E-cylinder and terminate in a rim 108 that is larger than the diameter of the E-cylinder.

A D-plate 104 may be positioned below the base of the E-cylinder. It may be insulated from the E-cylinder, as well as insulated from a ground plane 105 below it. The D-plate may in one sheet of metal or concentric sheets of metal, either solid or perforated by openings, or in one embodiment it may be formed of a lattice of metal wires, tubes, or bars. It may be connected, via a conductor, to conductive feed 103 such as a coaxial cable.

Below the D-plate may be a ground plane 105 and a platform 106 to raise the antenna above ground level 107. The ground plane 105 may be, in one embodiment, at least 25'×25' for a transmission frequency of 1.630 MHz. In another embodiment, the ground plane may be at least 30'×30' for a transmission frequency of 940 kHz.

In one embodiment, the antenna can be placed on a building or tower to increase its height and avoid ground-level effects and interference.

The height of the E-cylinder, the diameter of the D-plate and the area of the ground plane may be designed to have a specific relationship to the broadcast frequency. In the case of 1.630 MHz, one embodiment of the antenna may have an E-cylinder (including the funnel structure) of approximately 6.38 meters, while the diameter of the D-plate may be approximately 3.8 meters. In the embodiment shown in FIG. 1, the diameter of the E-cylinder is 1.75 meters, the diameter of the lip of the funnel structure is 7.5 meters, the height of the platform is 3.2 meters, and the gap between the ground plane and the base of the E-cylinder is 1.3 meters. This configuration may in one embodiment be scaled larger or smaller by a scale factor.

The antenna may be fed via feeds (102 and 103) from a feed circuit or set of feed circuits. Specific multiple networks may be designed that feed approximately half of the transmitter input power to the E-cylinder 100, and approximately half to the D-plate 104. These networks may provide impedance isolation at the input, while allowing adjustment of the antenna element phasing to be such that the electric and magnetic fields generated by the antenna elements produce surface wave propagation.

Figure 2:
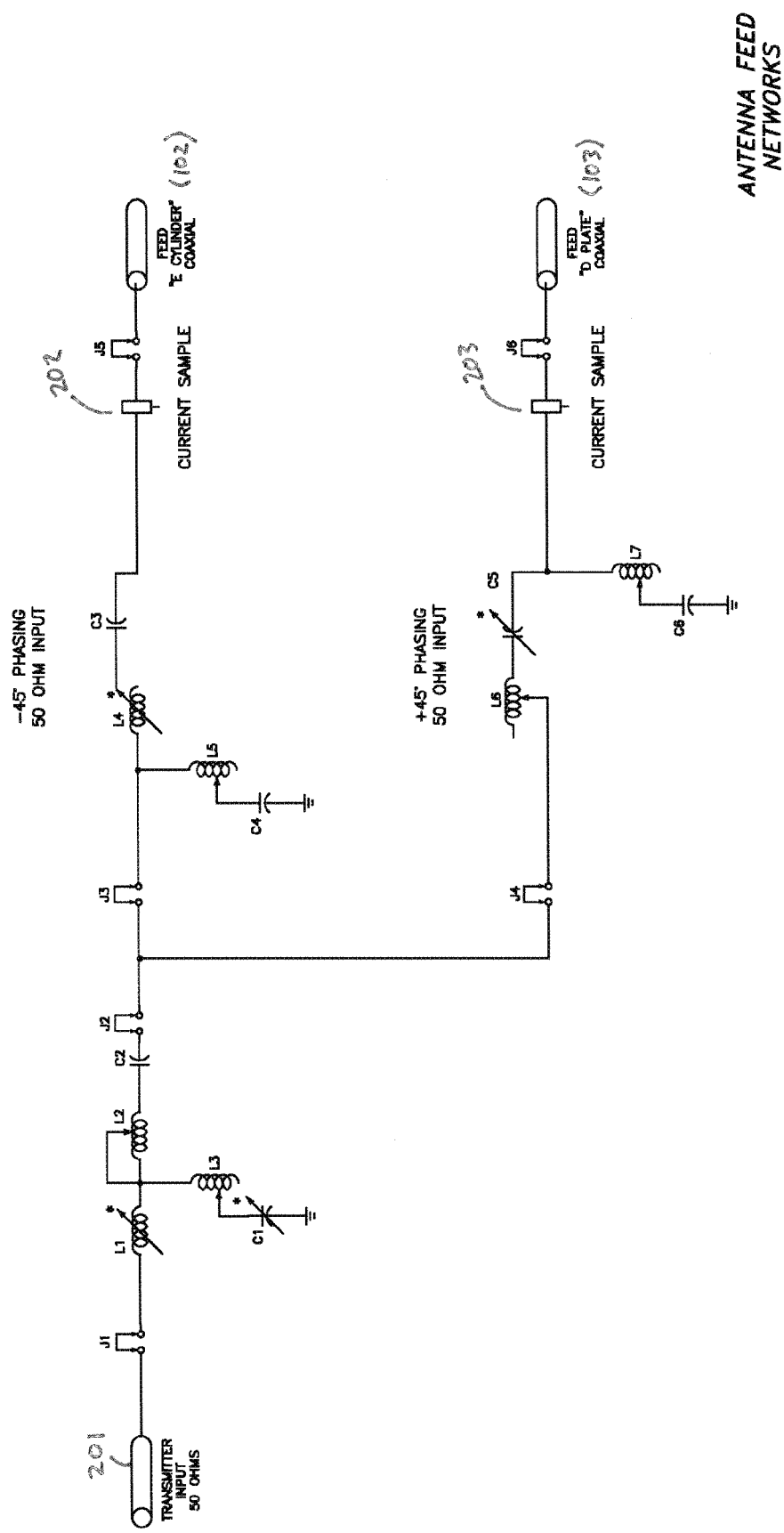
FIG. 2 is a schematic drawing illustrating an embodiment of antenna feed networks.

FIG. 2 shows one embodiment of specific antenna feed networks for an E-cylinder and a D-plate. A transmitter input 201 may provide a source of modulated alternating current to be transmitted over the antenna. This transmitter power may in one embodiment be fed to two antenna feed networks. These networks may be distinct, and each have adjustable impedance. In one embodiment, approximately half of the power from the transmitter input 201 may be sent to the E-cylinder via the first network, and approximately half may be sent to the D-plate via the second network. In one embodiment, the first network may be phased −45 degrees, and the second network may be phased +45 degrees. In one embodiment, these phases may be adjustable.

With the use of multiple networks in this embodiment, the antenna system may be able to be adjusted for maximum radiation efficiency. In addition, the input impedance within approximately 20 kHz of the operating carrier frequency may be sufficiently consistent that digital broadcasting signals may be transmitted with the antenna.

In one embodiment, an antenna as described herein may be tuned. Special current and voltage samples (202, 203) may be utilized to measure the magnitude and phase of both the current and voltage at the feed point of both antenna elements simultaneously. This allows the adjuster to precisely set the feed point parameters for maximum radiation. Once the feed point parameters are set, the network system that feeds both elements of the antenna may be adjusted to provide a resistive input impedance as compared to the reactive impedance of the elements. These resistances may be paralleled at the input circuit and then matched to the transmitter input resistance.

Figure 3:
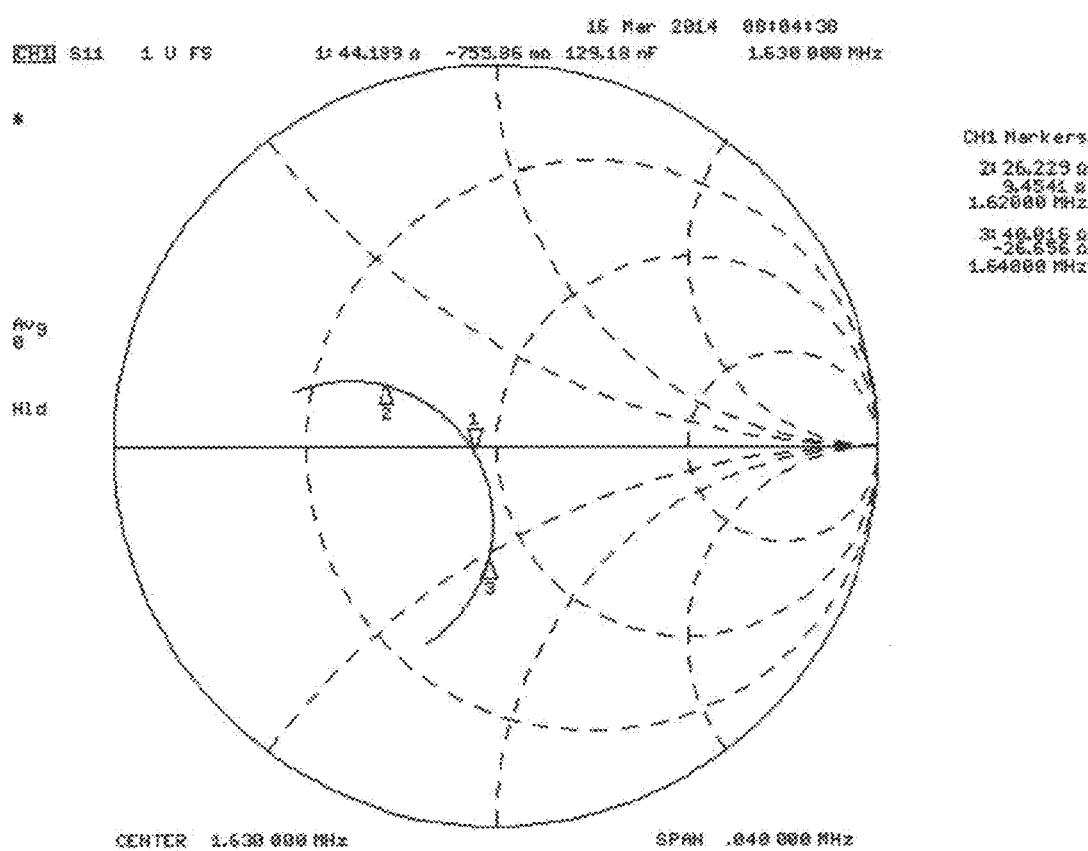
FIG. 3 is a Smith chart illustrating measured input impedance for an example antenna embodied in this disclosure.
Figure 4:
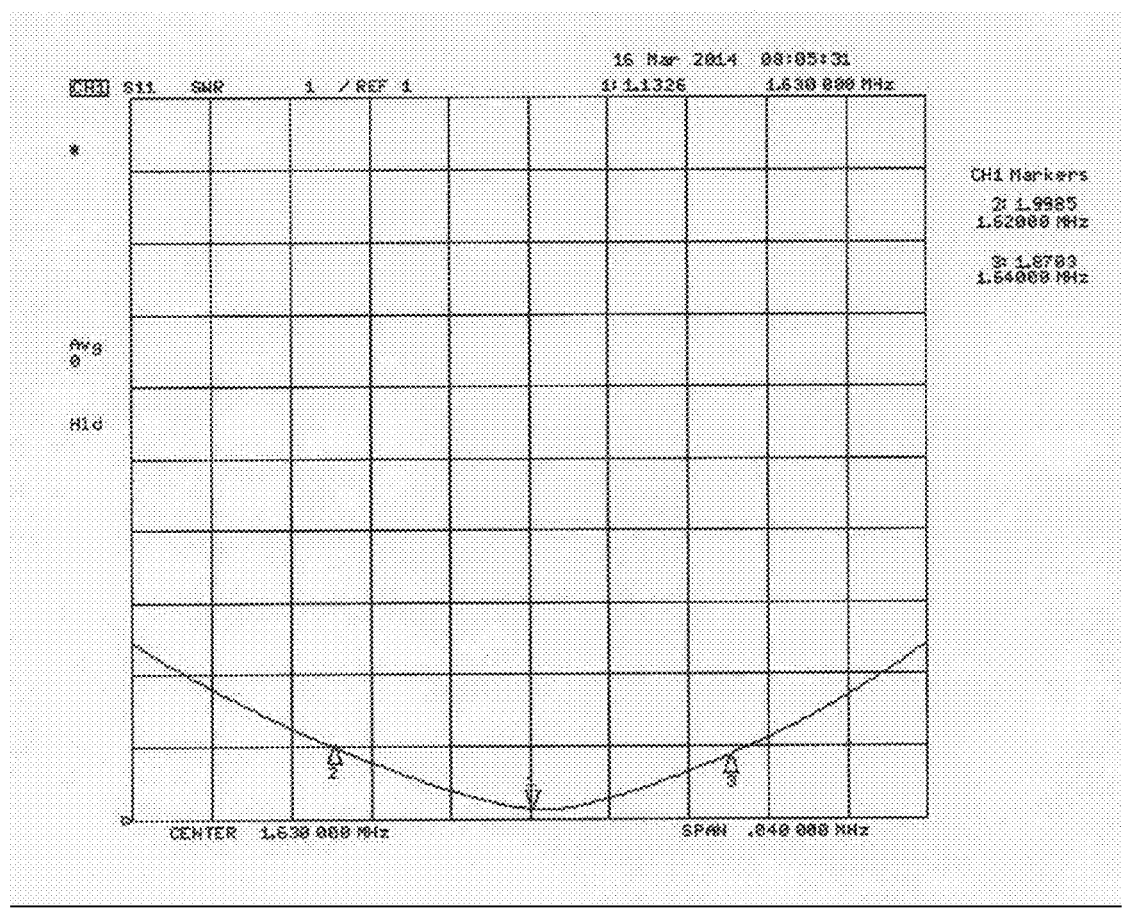
FIG. 4 is a plot of voltage standing wave ratio (VSWR) versus frequency for an example antenna embodies in this disclosure.

FIG. 3 is a Smith chart illustrating the measured input impedance for an example antenna as described in this disclosure, corresponding to the dimensions set forth in FIG. 1. The measurements describe a feed frequency of 1.630 MHz (301), as well as at 1.620 MHz (302) and 1.740 MHz (303). FIG. 4 is a plot of voltage standing wave ratio (VSWR) versus frequency corresponding to the same measurements as FIG. 3. These plots show antenna input parameters without any additional optimization. The plots demonstrate improved input bandwidth (impedance/VSWR) as compared to a conventional short monopole.

Figure 5:
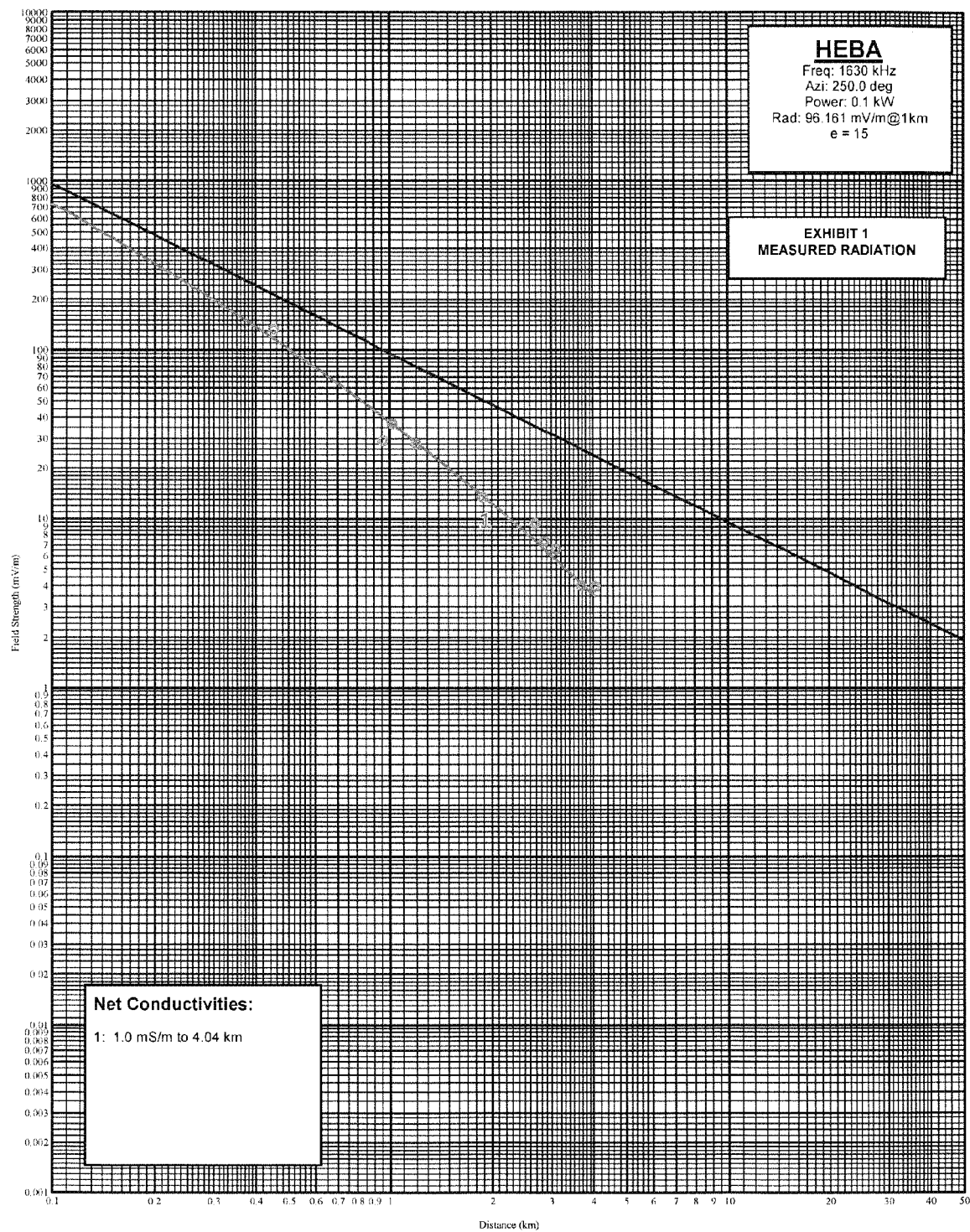
FIG. 5 is a plot of field strength versus distance for an example antenna embodied in this disclosure.

FIG. 5 is a chart showing field intensity for an example antenna as described in this disclosure, corresponding to the dimensions set forth in FIG. 1. Measurements were made with a Potomac Instruments FIM-41 field intensity meter. The measurements were performed on a bearing of 250° from the antenna, and within a distance of about 3-4 km from the antenna to minimize attenuation due to ground conductivity.

The data reflected in the plot are set forth in Table 1. The analyzed data yields an unattenuated field of 96.161 mV/m with an input power of 100 watts at 1.630 MHz. This equates to 304.1 mF/m for a nominal 1.0 kW input power.

TABLE 1

Field Strength Measurements

| Point number | Distance (km) | Field Strength (mV/m) |
| --- | --- | --- |
| 1 | 0.06 | 960 |
| 2 | 0.45 | 133 |
| 3 | 0.96 | 29.1 |
| 4 | 1.02 | 37.0 |
| 5 | 1.20 | 28.0 |
| 6 | 1.88 | 13.5 |
| 7 | 2.68 | 9.40 |
| 8 | 2.85 | 7.40 |
| 9 | 3.09 | 6.65 |
| 10 | 3.68 | 4.00 |
| 11 | 4.04 | 3.97 |

Exemplary embodiments have been described with reference to specific configurations. The foregoing description of specific embodiments and examples have been presented for the purpose of illustration and description only, and although the invention has been illustrated by certain of the preceding examples, it is not to be construed as being limited thereby.

What is claimed is:

1. A high-efficiency broadband antenna comprising:
   a D-plate comprising:
   a horizontal conductor raised above and insulated from a ground plane; and a D-plate feed conductor; an E-cylinder comprising:
      a vertical hollow conductive cylinder of smaller diameter than the D-plate, which is mounted concentrically above and insulated from the D-plate, and a funnel-shaped conductor with a lower lip which has the same diameter as the vertical hollow conductive cylinder, and an upper lip which has a larger diameter than the vertical hollow conductive cylinder, wherein the vertical hollow conductive cylinder has an upper lip, and wherein the lower lip of the funnel-shaped conductor is connected to the upper lip of the vertical hollow conductive cylinder; and
      an E-cylinder feed conductor;
   a transmitter input feed, connected to a source of modulated alternating current; an antenna tuning circuit configured to receive the transmitter input feed; a first antenna feed network, with adjustable impedance, configured to feed power from the antenna tuning circuit to the E-cylinder; and a second antenna feed network, with adjustable impedance, configured to feed power from the antenna tuning circuit to the D-plate;

wherein the antenna tuning circuit is adjusted to provide a resistive input as compared to a reactive impedance of the E-cylinder and the D-plate once the adjustable impedance on the first antenna feed network and the adjustable impedance on the second antenna feed network are set; and wherein half the power from the transmitter input feed is provided to each of the E-cylinder and the D-plate.

2. The antenna of claim 1, wherein the voltage standing wave ratio is less than about 3:1 when the input feed frequency is within a frequency band of width 0.040 MHz.

3. The antenna of claim 2, wherein the voltage standing wave ratio is less than about 3:1 when the input feed frequency is between 1.620 MHz and 1.640 MHz.

4. The antenna of claim 2, wherein the voltage standing wave ratio is less than about 2:1 when the input feed frequency is within a frequency band of width 0.040 MHz.

5. The antenna of claim 3, wherein the voltage standing wave ratio is less than about 2:1 when the input feed frequency is between 1.620 MHz and 1.640 MHz.

6. The antenna of claim 1, further comprising one or more means for measuring the magnitude and phase of both current and voltage at each antenna feed network simultaneously.

7. The antenna of claim 6, further comprising one or more tuners configured to adjust the impedance of the first and/or second antenna feed network in correlation with the input to said means for measuring.

8. The antenna of claim 1, wherein, when the transmitter input feed feeds a power of 100 watts at 1.630 MHz, the average measured field strength transmitted by the antenna at 1 km over a period of one hour is at least 70 mV/m.

9. The antenna of claim 8 wherein the measured field strength is at least 80 mV/m.

10. The antenna of claim 9 wherein the measured field strength is at least 90 mV/m.

* * * * *